United States Patent [19]
Denisevich, Jr.

[11] Patent Number: 4,505,841
[45] Date of Patent: Mar. 19, 1985

[54] FUSED 6,6,6-MEMBERED HETEROCYCLIC ELECTROACTIVE POLYMERS

[75] Inventor: Peter Denisevich, Jr., El Cerrito, Calif.

[73] Assignee: Chevron Research Company, San Francisco, Calif.

[21] Appl. No.: 442,393

[22] Filed: Nov. 17, 1982

[51] Int. Cl.³ .............................................. H01B 1/00
[52] U.S. Cl. .................................... 252/500; 252/512; 252/518; 528/183; 528/210; 528/342; 528/363; 528/374
[58] Field of Search ............... 528/363, 183, 210, 342, 528/374; 252/500, 510, 518, 512

[56] References Cited

U.S. PATENT DOCUMENTS

| | | | |
|---|---|---|---|
| 3,130,182 | 4/1964 | Frazer | 528/363 |
| 3,130,183 | 4/1964 | Frazer | 528/363 |
| 3,734,893 | 3/1973 | Studinka et al. | 528/363 |
| 3,966,987 | 6/1976 | Suzuki et al. | 252/500 |
| 4,344,869 | 8/1982 | Blinne et al. | 252/500 |
| 4,344,870 | 8/1982 | Blinne et al. | 252/500 |
| 4,360,644 | 11/1982 | Naarman et al. | 252/500 |
| 4,375,427 | 3/1983 | Miller et al. | 252/500 |

Primary Examiner—Lester L. Lee
Attorney, Agent, or Firm—S. R. Lapaglia; E. J. Keeling; A. Stephen Zavell

[57] ABSTRACT

Tractable doped electroactive polymers are fabricated from the virgin polymer by contacting the polymer with acceptor conductivity modifier atoms or groups of atoms. The polymers comprise recurring units of a fused unsaturated 6,6,6-membered heterocyclic ring systems wherein two heteroatoms are in the center ring and the recurring units are connected between the carbocyclic rings.

20 Claims, No Drawings

FUSED 6,6,6-MEMBERED HETEROCYCLIC ELECTROACTIVE POLYMERS

BACKGROUND OF THE INVENTION

This invention relates to electroactive organic polymeric materials. More specifically, this invention relates to associating electroactivating agents known in the art as dopants with an organic polymer.

Recently, research has been conducted into organic polymeric materials in order to modify their room temperature electrical conductivity by reacting them with electron donor or acceptor molecules. The electron donor or acceptor molecules, generally known in the art as n-type and p-type dopants respectively, can transform the organic polymeric materials so that these modified organic polymeric materials exhibit semiconducting and metallic room temperature electrical conductivity. Polyacetylene is an example of an organic polymeric material whose room temperature electrical conductivity can be modified over several orders of magnitude above its insulator state, by the incorporation of dopant molecules, A. J. Heeger et al, U.S. Pat. No. 4,222,903, said patent incorporated herein by reference. Other examples of organic polymeric materials whose room temperature electrical conductivity can be enhanced by several orders of magnitude over their insulator state by means of incorporation of dopant molecules are poly-p-phenylene, polypyrrole, poly-1,6 heptadiyne, and polyphenylene vinylene. However, all of the above recited examples are of organic polymeric materials which are completely insoluble or infusible and hence are completely intractable.

Other examples of organic polymers whose room temperature electrical conductivity can be modified with the aid of dopants are polyphenylene sulfide and poly-m-phenylene. However, the above recited materials though being tractable in their original virgin state, undergo irreversible chemistry when reacted with dopants which modify their room temperature electrical conductivity.

This irreversible chemistry imparts upon these dopant modified organic polymeric materials a state of intractability. Upon removal of the doping agents, these materials do not revert to the chemical structure which they originally exhibited prior to being modified by the dopants. The inorganic material polysulfur nitride is also considered a polymeric conductor. As with the previously recited polymeric materials, polysulfur nitride is also completely intractable.

For use in a wide variety of electronic device applications, it is highly desirable to have available organic polymeric electrically conducting materials having a preselected room temperature conductivity which can be varied over a broad range. This range should preferably extend from the insulator state of the unmodified organic polymeric material through the semiconducting regime and extending into the highly conducting metallic state. It is also desirable that these organic polymeric electrically conducting materials should be tractable and hence processable so that useful articles of any desired shape and size can be fabricated. Tractable organic polymers are those which can be readily shaped, formed, molded, pressed, cast, etc., into desired articles from solution after completion of the polymerization reaction of the organic polymeric materials or from the liquid state, i.e. either from the melt, fluid glassy state or from solution.

SUMMARY OF THE INVENTION

I have invented an electroactive polymeric material comprising a dopant modified organic polymer whose room temperature electrical conductivity is controlled in a highly selective and reversible manner. Electroactive polymer is defined as a polymer having a conductivity which has been modified with electron acceptor or donor dopants to be greater than the conductivity of the virgin state of the polymer. The electroactive polymeric material is fabricated from a virgin polymer by modifying the polymer with a conductivity modifier, i.e. electron acceptor dopants.

The virgin polymer is completely tractable and solution processable and exhibits excellent mechanical and thermal properties as well as being highly stable to oxidative degradation. The electroactive organic polymeric material is comprised of recurring units of a fused unsaturated 6,6,6-membered heterocyclic ring system wherein the central ring contains the heteroatoms and a charge compensating ionic dopant associated therewith. The recurring units are diradicals. A diradical is defined as a molecule that has two unsatisfied positions avialable for linking into the polymer chain. The diradicals are directly linked to one another, or may be connected to one another via connecting units. A "connecting unit" is defined as any atom or group of atoms which can link the hereinabove diradicals together into a polymer chain. The connecting unit must be conjugated or maintain the pi orbital overlap with the recurring heterocyclic diradicals.

A p-type electroactive organic polymer is obtained by reacting the virgin polymer with oxidizing electron acceptor dopants. Electron acceptor dopants induce p-type conductivity in the polymer by oxidizing the polymer to a polycation and the dopant is reduced to an anion. The charges of the polymer and the charge compensating ionic dopants balance so that the polymer is electronically neutral. The oxidation proceeds solely by an electron transfer.

Alternatively, the polymer can be rendered electroactive by electrochemical oxidation, i.e., electrochemical doping. In this method, the polymer is immersed in a suitable electrolyte solution and used as one electrode of an electrochemical cell. Upon passing an electric current through the cell an electron is removed from the polymer by an electrode, the polymer becomes oxidized, and charge-compensating anions are incorporated into the polymer from the supporting electrolyte solution.

In both methods of doping, the resulting electroactive polymer consists of a charged polymer backbone incorporating charge-compensating ionic dopants. More specifically, the electroactive polymer is a positively charged polymer backbone incorporating anionic dopants.

The desired value of the room temperature electrical conductivity of the dopant modified electroactive organic polymer is preselected by controlling the level of incorporation of the dopants into the virgin polymer. A sufficient concentration of a charge compensating ionic dopant is defined to be that concentration which when associated with the polymer effects a significant increase in the conductivity, i.e. on the order of about 10% or greater. Alternatively, the desired value of the room temperature electrical conductivity of the dopant modified electroactive organic polymer is preselected by controlling the length of the reaction time between the virgin polymer and dopants.

The highly selective and reversible modification of the electrical conductivity of the dopant containing organic polymeric material together with the tractability and processability of the virgin polymer is highly desirable in that the fabrication of useful articles and devices such as primary and secondary batteries, photovoltaic devices. Furthermore, the materials described in this invention can be utilized as active components in such devices and articles as electrochromic displays and photolithographic processes.

DETAILED DESCRIPTION OF THE INVENTION

The electroactive organic polymers are fabricated from the modification of tractable and processable virgin polymers consisting of recurring diradical units of fused 6,6,6-membered unsaturated heterocyclic ring system polymer with suitable conductivity modifiers. The recurring diradical units of the polymer contain the heteroatoms in the central six-membered ring. The central six-membered ring contains two heteratoms selected from the group consisting of O, S, N or substituted N.

The recurring diradical units are connected through the outer phenyl rings. Suitable examples of fused 6,6,6-membered heterocyclic recurring units are the diradicals of phenoxazine, phenothiazine, N-alkylphenothiazine, thianthrene, phenoxathiin, dihydrophenazine, dialkyldihydrophenazine, dibenzodioxin, their substituted derivatives, and mixtures thereof. Optionally, the recurring units can be substituted on the outer 6-membered phenyl rings with one or more substituents to adjust either the electrical or morphological properties of the polymers fabricated therefrom. Suitable examples of substituents are the halogens, lower alkyl groups, lower alkoxy, aryl, and the like. Optionally, the recurring units can be interspersed with one or more connecting units such as O, S, aryl, substituted aryl, alkenyl, thioalkenyl, thioaryl, and the like. Preferred connecting units are phenylene, —CH=CH—, and 1,3,4-oxadiazolediyl. The connecting units can be the same or different between adjacent recurring units in the polymer chain.

More specifically, the substituted or unsubstituted recurring diradicals can be linked through carbon atoms at any of the 1 thru 4 positions for one link combined with any of the 6 thru 9 positions for the other link, but connections at the 2,8; 3,8; 2,7; and 3,7 positions in the polymer are preferred. The ring system is numbered as follows:

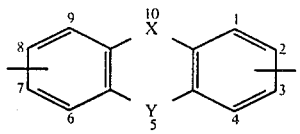

wherein X and Y are independently selected from N, O, S, or N—$R_1$. $R_1$ is lower alkyl $C_1$-$C_6$, aryl, and cycloalkyl. Preferably $R_1$ is phenyl or methyl. For example, a preferred recurring unit for poly 3,7-(thianthrene-4,4'-dithiobiphenylene) is illustrated as follows:

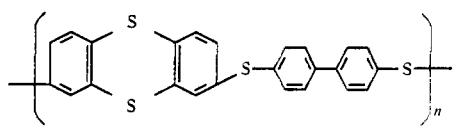

The polymer can be a homopolymer of the diradicals and the substituted derivatives thereof or a copolymer of the diradicals. A homopolymer is defined as a polymer comprising the same recurring diradical. A copolymer is defined as a polymer comprising different diradicals. In addition, the polymer is a copolymer if the same or different recurring diradicals are interspersed with connecting units.

The association of the polymer is its oxidized polycationic state with anionic dopants produces an electroactive polymer with p-type conductivity. A suitable negatively charged compensating dopant, i.e. anion dopants, can be an anion such as the halogen ions, $AsF_4^-$, $AsF_6^-$, $ClO_4^-$, $PF_6^-$, $SO_3CF_3^-$, $BF_4^-$, $NO_3^-$, $F^-$, $Cl^-$, $Br^-$, $I^-$, $I_3^-POF_4^-$, $SiF_5^-$, $SbCl_6^-$, $SbF_6^-$, $HSO_4^-$, organic anions ions such as $CH_3CO_2^-$, (acetate), $C_6H_5CO_2^-$ (benzoate), $CH_3C_6H_4SO_3^-$ (tosylate), and the like. Mixtures of the charge-compensating dopants can be employed.

The electroactive polymers of the invention have the following formula:

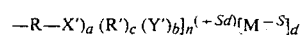

where a is either 0 or 1; b is either 0 or 1; c is either 0 or 1; n is an integer between 1 and 1,000; d is an integer between 1 and 2,000; s is an integer 1, 2, or 3; R is either an unsubstituted or substituted fused 6,6,6-membered heterocyclic diradical ring system; R' is identical to or different from R; X' is a connecting unit comprising of a single atom, or a group of atoms; Y' is a connecting unit which is identical to or different from X'; and M is an atom or a group of atoms acting as a charge-compensating anionic dopant whose electrical charge is opposite to the charge exhibited by the recurring repeat units of the polymer backbone:

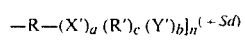

The repeat units from the polycation of the electroactive polymer.

A preferred R or R' is selected from the group consisting of the diradicals of the formula:

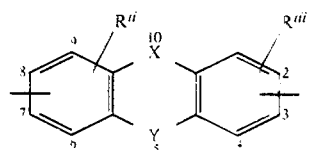

wherein X and Y are as previously defined. Preferred fused ring systems are when X and Y are O and N—H, O and N—$R_1$, S and N—$R_1$, S and S, O and S, and N—R, and N—$R_1$; $R_1$ is as defined previously, $R^{ii}$ and $R^{iii}$ are from one to three substituent groups independently selected from H; disubstituted amino; alkyl of 1 to 4 carbon atoms; alkoxy of 1 to 4 carbon atoms; an alkylthio of 1 to 4 carbon atoms; a cycloaliphatic group of 5 or 6 carbon atoms; an aryl group of 6 to 10 carbon atoms; an aryl group of 6 to 10 carbon atoms substituted by 1 to 3 alkyl groups of 1 to 4 carbon atoms, alkoxy groups of 1 to 4 carbon atoms, 1 to 3 cyano groups, 1 to 3 halogen atoms, dialkyl amino groups of 1 to 4 carbon atoms, an alkylthiol of 1 to 4 carbon atoms; or a 5- or 6-member nitrogen-containing unsaturated heterocyclic group.

The term "alkyl" refers to both straight- and branched-chain alkyl groups. Suitable examples are methyl, ethyl, propyl, isopropyl, butyl, i-butyl, s-butyl, and t-butyl.

The term "alkoxy" refers to the group $R^2O$— wherein $R^2$ is alkyl. Suitable examples are methoxy, ethoxy, propoxy, isopropoxy, butoxyl, i-butoxy, s-butoxy, and t-butoxy.

The term "alkylthio" refers to such examples as methylthio, ethylthio, propylthio, isopropylthio, butylthio, i-butylthio, t-butylthio and s-butylthio.

Suitable examples of cycloaliphatic are cyclopentyl, cyclohexyl, 3-methylcyclopentyl, and the like.

The term "aryl" refers to an aromatic hydrocarbon radical such as phenyl, naphthyl, and the like. Suitable examples of an aryl substituted with an alkyl are 2-tolyl, mesityl, 3-isopropylphenyl and the like. Suitable aryl groups substituted with an alkoxy are 1-methoxy-2-naphthyl, 3-n-butoxyphenyl, and the like. Suitable aryl groups substituted with a cyano group are 4-cyanophenyl, 4-cyano-1-naphthyl, and the like. Suitable examples of an aryl with a halogen are 4-fluorophenyl, 3-chloro-4-bromo-1-naphthyl, and the like. Suitable examples of an aryl substituted with a dialkyl amino are 3-dimethylaminophenyl, 6-diethylamino-2-naphthyl, and the like. Suitable examples of an aryl substituted by an alkylthio are 4-butylthiophenyl, 3-methylthio-2-naphthyl, and the like. Suitable examples of 5- or 6-member nitrogen-containing heterocyclic groups are 3-pyrrolyl, 4-pyridyl, and the like. Suitable examples are substituted diradicals such as the diradicals of 1,6 dimethlphenoxazine; 1-methyl-9ethyl phenothiazine; 1,6 phenylthianthrene; 3-methoxyl-6-methyl phenoxathin; 1 methyl-6-phenyl dihydrophenazine, and the like.

More specifically, R and R'are unsubstituted or substituted diradicals previously recited or mixtures of diradicals which are linked to one another either directly or via the connecting units X' and Y' by formed bridges between carbon atoms on the outer phenyl rings. Preferably the bridges are formed at the 2,7 or 3,8 positions.

The connecting units X' and Y' can be selected from the group comprising:

$-O-$; $-S-$; $-\overset{R_1}{\underset{|}{N}}-$; $-CH=CH-$; $N\overset{\phantom{O}}{\underset{O}{\underset{\|}{\diagdown}}\underset{\phantom{O}}{\diagup}}N$;

$-CH=CH-CH=CH-$; $-CH=CH-S-CH=CH-$;

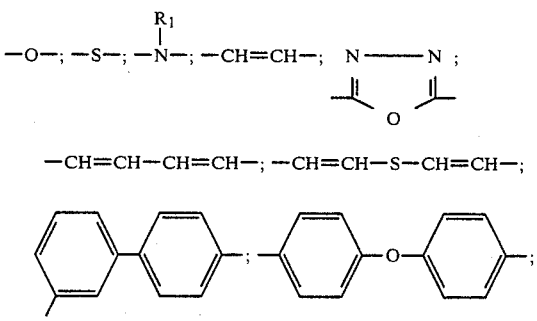

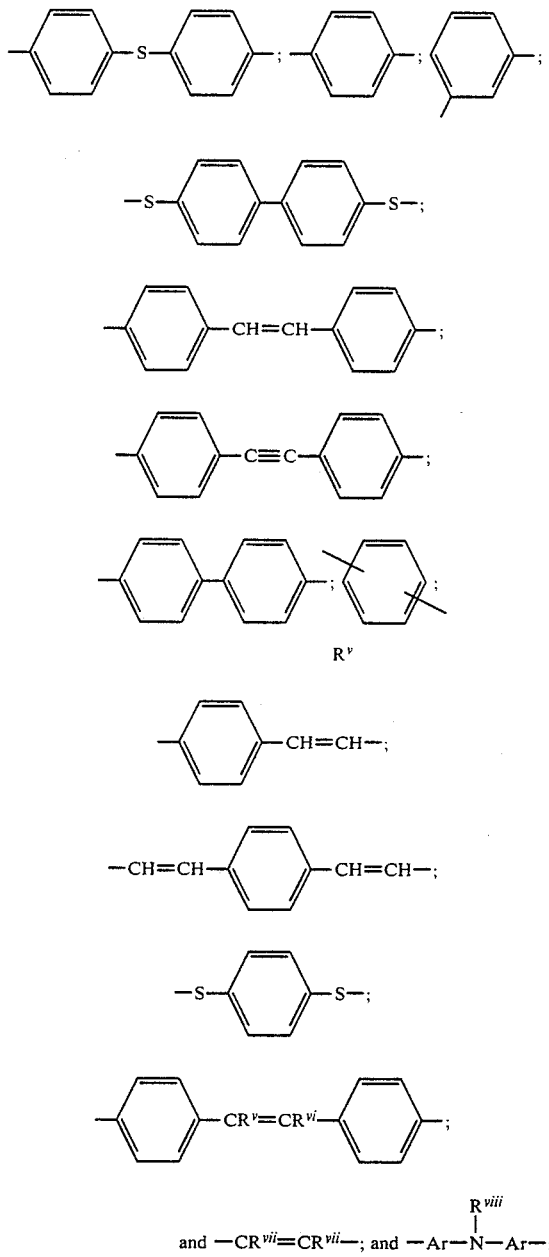

wherein $R_1$ is defined previously, and $R^v$, $R^{vi}$ and $R^{vii}$ are H or methyl, methoxy, halogen and mixtures thereof, and $R^{viii}$ is lower alkyl $C_1-C_4$ or p-substituted phenyl, Ar is phenylene or biphenylene. Biphenylene, vinylene, phenylene, and 2,5-(1,3,4-oxadiazolediyl) connecting groups are preferred connecting units.

The size of n determines the physical properties of the electroactive polymer. n is from 1 to 1,000. Preferably, n is from 3 to 500. Most preferably, n is from 5 to 300 when b and c are zero. Tractable films are formed with electroactive polymer whose n exceeds 50. Molecular weights of the polymer should be between 250 and 500,000. A preferred molecular weight is 10,000 or greater.

The enhancement is conductivity of the electroactive polymer above the conductivity of polymer in the virgin state is determined by d. The value for d is not greater than 2 n. The conductivity is increased and adjusted by increasing d. Conductivities in the semiconductor region can generally be achieved with d values of about 5 percent the n value.

Preferred electroactive polymers are doped polymers that have conductivities greater than about $1\times10^{-10}$ ohm$^{-1}$ cm$^{-1}$.

The R and R' groups are the same or different. When a is 1, b and c are zero, R' and Y' drop out and the polymer has the following formula:

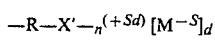

A generally preferred phenothiazine polymer has the formula:

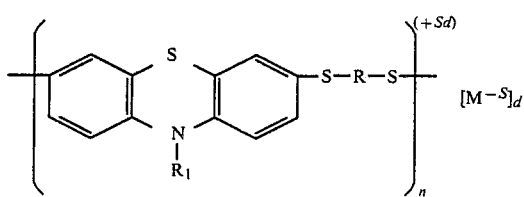

wherein $R_1$ is as defined previously and R is phenylene or biphenylene.

A preferred polymer is poly 3,7-(N-methylphenothiazine)-2,5-(1,3,4-oxadiazole) of the formula:

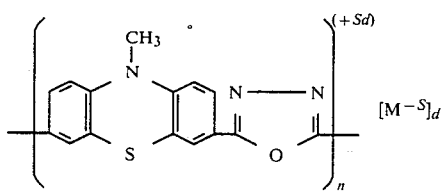

wherein R is 3,7 N-methylphenothiazine and X' is 2,5-(1,3,4-oxadiazole).

Another preferred polymer occurs when R is the 3,7 phenoxathiin diradical and X' is 4,4-dithiobiphenylene and the polymer has the formula:

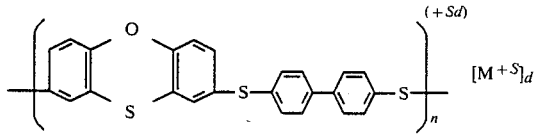

Still another preferred polymer occurs when R is the 2,7-thianthrene diradical and X' is 1,4 dithiophenylene and the polymer has the formula:

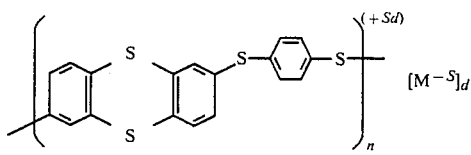

When a, b, and c are zero, R', X', Y' drop out and the polymer has the formula:

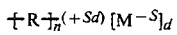

A preferred polymer is poly (3,7-thianthrene). The polymer has the formula:

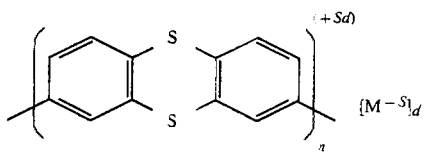

POLYMER FABRICATION

The starting materials for preparing the electroactive polymers of this invention are polymers and copolymers comprising recurring units of fused nitrogen-containing unsaturated heterocyclic ring system. Preferably the recurring units are substituted or unsubstituted fused 6,6,6-membered heterocycles wherein the heteroatoms are in the central 6-membered ring.

These polymers and copolymers may be synthesized in a variety of ways. Since these polymers and copolymers are comprised of aromatic nuclei and connecting units, many of the synthetic methods suitable for linking benzene nuclei or other aromatic and connecting units may be employed. For example, polymers linked via a sulfur connecting unit may be prepared by treatment of a dihalo derivative of the 6,6,6-heterocycle with sodium sulfide in analogy with Edmonds and Hill, U.S. Pat. No. 3,354,129, incorporated herein by reference.

Phenylene linking units may be synthesized by treatment of the dihalo heterocycle with 1,4-dibromobenzene and magnesium metal to effect a Grignard coupling, as taught in *Bull. Chem. Soc. Japan* 51, 2091 (1978) *J. Polymer Sci.* 18, 9 (1980), incorporated herein by reference. 1,3,4-oxadiazole connecting units may be introduced by condensation polymerization of a dicarbyoxy heterocycle and hydrazine as taught in *J. Polymer Sci. A2*, 1157 (1964), incorporated herein by reference.

Alternatively, polymers comprising only 6,6,6-heterocyclic repeat units (no connecting groups) may be prepared by the metal-catalyzed coupling of the dihaloheterocycles. For example, see Yamamoto, *J. Polymer Sci.*, "Polymer Letters", 18, 9 (1980) and ibid. 18, 2869 (1980), incorporated herein by reference. According to this method, a dihalo compound is treated witn Mg metal and a transition metal complex to form a polymer:

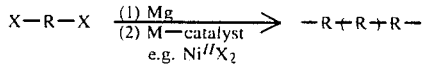

In all these cases the monomers and starting materials are well known compounds having then synthesized in a variety of ways.

TRACTABLE POLYMER FABRICATION

Subsequent to polymerization, articles such as fibers, ribbons, or free-standing films are cast from solution. The solution is formed by dissolving the desired polymer in a solvent which consists of sulfuric acid, formic acid, methane sulfonic or polyphosphoric acid. The solution temperature is from about 25° C. to about 200° C. The polymers are coagulated into solid shapes such as fibers, ribbons, or free-standing films in a basic coagulation bath. For free-standing films, the polymers are fabricated from solutions containing about 2 to 25% polymer dissolved in the solvent. At concentrations which exceed 10%, the cast films take on a anisotropic morphology. The anistropic property enhances the conductivity in the anistropic direction. An amine, for example triethylamine, dissolved in a protonic solvent such as $H_2O$ and preferably ethyl alcohol comprises the coagulation bath. The bath is maintained at a lower temperature than the dissolution temperature of the polymer in the solvent. Usually room temperature is selected as the operating temperature of the coagulation bath. The fabricated articles are dried. Elevated temperatures, usually 60° C., and reduced pressure accelerated the drying process. Drying is continued until no further weight loss is observed.

Alternatively, films are cast into water, comprising the coagulation bath, followed by neutralization in aqueous bicarbonate. Neutralized films are washed in water and dried at elevated temperatures, 60°-100° C., under reduced pressure.

POLYMER CONDUCTIVITY MODIFICATION

After fabrication of the desired articles from the polyfused heterocyclic polymers by means of the procedure described above, the articles are rendered electroactive by, for example, chemical or electrochemical procedures. The articles can be rendered electroactive in an atmosphere which is inert with respect to the polymer and dopant, by contacting them with suitable conductivity modifiers, i.e. dopants. An inert atmosphere is defined as an atmosphere which does not react with the polymer, the dopant, or the electroactive polymer. For example, the atmosphere can be argon, helium, and nitrogen and the like. The inert liquid medium should be able to wet and swell the polymer but not react with it. The doping can also be carried out in an inert liquid medium such as tetrahydrofuran, acetonitrile and the like. The dopants are oxidizing or electron accepting molecules. The dopants may be in the form of gases or vapors, pure liquids or liquid solutions. Preferably, oxygen and water moisture are excluded during and after the doping process because the conductive polymers tend to degrade, i.e. lose conductivity, when exposed thereto.

For example, the polymer can be contacted with $AsF_5$ or $SbCl_5$ in pentane or nitromethane. The conductivity modifier concentration can be from about 0.001 to about 1 molar and preferably from about 0.01 to about 0.5 molar in the pentane or other suitable solvent. Alternative doping methods are taught in U.S. Pat. No. 4,204,216 and incorporated herein by reference.

The incorporation of the dopants into the polymer can be observed by a colar change in the polymer as well as an enhanced conductivity. For example, a virgin polymer film that is yellow or colorless changes to red, green or black with a metallic luster upon doping, and the measured conductivity increases by many orders of magnitude.

Alternatively, the polymers can be oxidized to their conductive forms using electrochemical techniques. In this method, herein referred to as electrochemical doping, the polymer is immersed in a suitable electrolyte solution and used as one electrode of an electrochemical cell. Upon passing an electric current through such a cell the polymer becomes oxidized and charge-compensating anions from the supporting electrolyte become incorporated into the polymer. This doping also proceeds with the characteristic color change described above. Thus, the polymer can be electrochemically doped with whatever appropriately charged ion is present in the electrolyte solution. Electrolyte solutions are comprised of a salt dissolved in a solvent. Suitable solvents are acetonitrile, tetrahydrofuran, 2-tetrahydrofuran, propylene carbonate, dimethylformamide, dimethylsulfoxide and the like. Alternative electrolytes are specified in U.S. application Ser. No. 334,509, filed Dec. 28, 1981, entitled "Batteries Fabricated With Electroactive Polymers", and completely incorporated herein by reference. Suitable anions are $Cl^-$, $ClO_4^-$, $BF_4^-$, and $PF_6^-$. The extent of doping can be easily controlled by adjusting the amount of charge electrochemically injected into the polymer, either by controlling the magnitude of the current used (galvanostatic charging) or by controlling the potential of the polymer electrode with respect to a reference electrode (potentiostatic charging).

The above-described electrochemical doping process is completely reversible. The polymer can be "undoped" and returned to its original, neutral, non-conducting state simply by applying a current opposite in sign to that used for the doping process. Upon complete undoping the color of the polymer reverts back to its original color. Thus, for example, an oxidized, conducting poly N-methylphenothiazine-oxiadiazole can be reduced completely to its neutral, non-conducting form, and the charge-compensating anions incorporated during the electrochemial reduction process are expelled from the article during electrochemical re-oxidation.

For film forming procedures, doping, dopants and conductivity measurements, the teachings of U.S. Pat. No. 370,231, filed Apr. 22, 1982, are completely incorporated herein by reference.

Having described the methods of fabrication and the basic polyfused heterocyclic systems, the following examples are intended to be illustrative of the invention and not meant to limit the scope thereof. Modification which would be obvious to one of ordinary skill in the art are contemplated to be within the scope of the invention.

EXAMPLES

EXAMPLE 1

Preparation of Poly 3,7-(N-methylphenothiazine-2,5-oxadizaole

N-Methyl-phenothiazine-3,7-dicarboxylic acid prepared according to Caugnill and Casadevall (*Comptes Rendus*, 238, 908 (1954), incorporated herein by reference) 0.5 g, and hydrazine sulfate 0.216 g were combined in polyphosphoric acid 10 ml. The mixture was heated under nitrogen with stirring at 100° C. during 48 hours. The reaction mixture was quenched in 250 ml water and the precipitated polymer washed with 5% sodium bicarbonate solution. Yield 0.51 gram. The polymer had the formula:

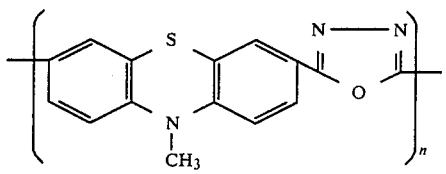

Example 2

Electrochemical Doping of the Polymer of Example 1

For electrochemical doping, the polymer was dissolved at 130° C. in sufficient polyphosphoric acid to give a 5 % weight/weight solution. The Pt wire was dipped in the solution and then immersed in a coagulation bath of 10% triethylamine in ethanol. Thereafter the platinum wire coated with the polymer was immersed in an electrolyte solution of 0.1 M tetraethylammonium tetrafluoroborate in acetonitrile.

The polymer-coated wire was connected to an E.G. and G. Princeton Applied Research Apparatus comprising a Universal programmer and a potentiostat/galvanostat, with recorder. The polymer-coated end of the wire was then immersed into an 0.1 M solution of tetraethylammonium tetrafluoroborate in acetonitrile. A linear potential sweep, varying fro 0 to 1.0 volts vs. Ag/AgNO$_3$ electrode was applied to the polymer-coated wire. An anodic current began to flow as the potential was scanned positive. A current peak was observed at +0.65 V. This indicates the sequential uptake of electrons by the polymeric repeat units. At this point, the polymer is positively charged and contains tetrafluoroborate anions as the charge-compensating dopant species. In effect, the polymer was made electroactive by the application of a potential of about +0.65 volts in the presence of an electrolyte solution capable of providing charge-compensating dopant ions. Upon reversing the direction of the potential sweep, i.e. +1 to 0 V, the cathodic current peak was observed at nearly the same voltage and was essentially equal in magnitude to the anodic current peak. This indicates reversible removal of the electrons previously injected into the polymer. This procedure returns the polymer to its original uncharged, undoped state.

Example 3

Preparation of Poly 3,7-(phenoxathiin-4,4'-dithiobiphenylene

One mmole 3,7-dibromophenoxathiin was prepared according to Suter, et al. (*JACS*, 58, 717(1936), incorporated herein be reference) 1 mmole 4,4'-dimercaptobiphenyl was prepared according to Marvel and Caesar, (*JACS*, 73, 1097(1951) incorporated herein by reference.) These compounds were heated with 2 mmoles lithium hydroxide at 175° C. during 12-48 hours of N-methylpyrrolidionone. Precipitation with ethanol gives the polymer as a white powder. The polymer had the formula:

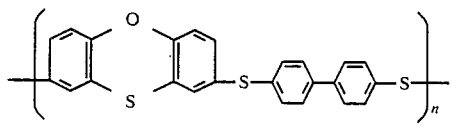

Example 4

Electrochemical Doping of the Polymer of Example 3

The polymer of Example 3 is applied to a platinum wire in accordance with the teachings of the specification. Thereafter, the polymer is doped according to the procedure of Example 2. The polymer exhibits a positive current peak which indicates that the polymer is positively charged and contains charge compensating anions. The doping process can be reversed and repeated.

Example 5

Preparation of Poly (1,4-dithiophenylene-2,6-thianthrene)

One mmole 2,6-dibromothianthrene, (according to Gilman et al., *JACS*, 77, 5944(1955) [incorporated herein by reference]), 1 mmole 1,4-dimercaptobenzene. and 2 mmoles lithium hydroxide are heated at 150°-200° C. in 200 ml N-methylpyrrolidinone during 12-48 hours. The mixture is poured into ethanol to give the polymer as a white powder. The polymer has the formula:

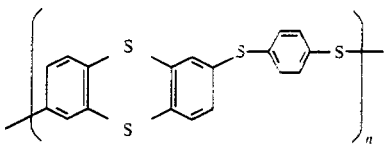

Example 6

Electrochemical Doping of the Polymer of Example 5

The polymer of Example 5 is applied to a platinum wire in accordance with the teachings of the specification. Thereafter, the polymer is doped according to the procedures of Example 2. The polymer exhibits a positive current peak which indicates that the polymer is positively charged and contains charge compensating anions. The doping process is reversible.

What is claimed is:

1. A p-type electroactive polymer which comprises a charge polymer backbone of recurring units of a fused 6,6,6-membered unsaturated heterocyclic ring system wherein 6,6,6-membered unsaturated heterocyclic ring system connects into the polymer backbone through bonding in the outer carbocyclic rings, the central 6-member ring contains two heteroatoms para to each other, said heteroatoms selected from the group consisting of O, S, N, and substituted N, and a sufficient concentration of a charge-compensating anionic conductivity modifier associated therewith, wherein the polymer backbone is capable of undergoing reversible oxidation to form said charged polymer backbone.

2. The electroactive polymer according to claim 1 wherein the recurring units are selected from the group consisting of phenoxazine; N-alkyl phenoxazine; phenothiozine, thianthrene; phenoxathiin; dialkyldihydrophenazine; dihydrophenazine; dibenzodiozin; substituted derivatives thereof, wherin said substituted derivatives thereof are said recurring units substituted with from 1 to 3 substituents on the outer carbocyclic rings independently selected from H; disubstituted amino; alkyl of 1 to 4 carbon atoms; alkoxy of 1 to 4 carbon atoms; alkylthio of 1 to 4 carbon atoms; a cycloaliphatic group of 5 or 6 carbon atoms; an aryl group of 6 to 10 carbon atoms; an aryl group of 6 to 10 carbon atoms substituted by 1 to 3 alkyl groups of 1 to 4 carbon atoms, alkoxy groups of 1 to 4 carbon atoms, 1 to 3 cyano groups, 1 to 3 halogen atoms, dialkyl amino groups of 1 to 4 carbon atoms, an alkylthio of 1 to 4 carbon atoms; and a 5- or 6-membered nitrogen-containing unsaturated heterocyclic ring; and mixtures thereof.

3. The electroactive polymer according to claim 2 wherein the recurring units are linked into the polymer chain in the 2,7; 2,8; 3,7; or 3,8 positions.

4. The electroactive polymer according to claim 3 wherein the charge-compensating ionic dopant is an anion selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, acetate, benzoate, tosylate, or mixtures thereof.

5. The electroactive polymer according to claim 3 wherein the recurring units are interspersed with connecting units, said connecting unit is selected from the group consisting of $$-O-; -S-; -\overset{R_1}{\underset{|}{N}}-; -CH=CH-; -C\equiv C-;$$

—CH=CH—CH=CH—; —CH=CH—S—CH=CH—;

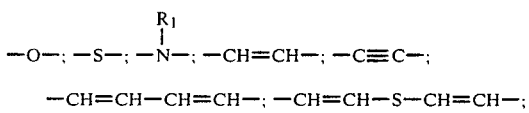

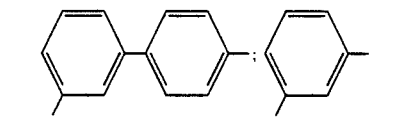

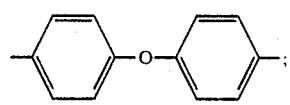

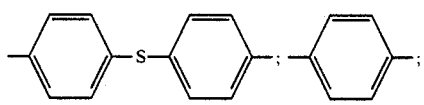

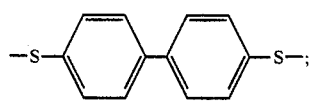

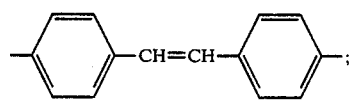

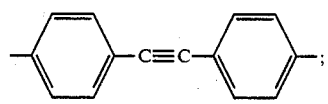

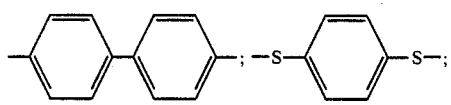

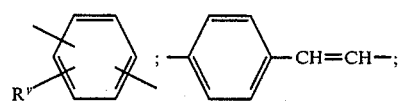

-continued

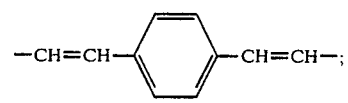

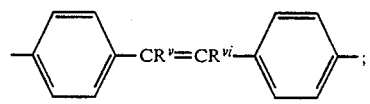

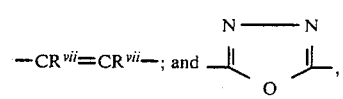

wherein $R_1$ is lower alkyl $C_1$-$C_6$, and cyclo alkyl, and $R^v$, $R^{vi}$ and $R^{vii}$ are H, methyl, methoxy, halogen, and mixtures thereof.

6. The electroactive polymer according to claim 5 wherein the fused 6,6,6-membered heterocyclic recurring units are interspersed with connecting units selected from the group consisting of phenylene, dithiophenylene —CH=CH—, biphenylene, dithiobiphenylene, and

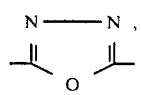

or mixtures thereof.

7. The electroactive polymer according to claim 6 or 3 wherein the recurring unit is phenoxathiin.

8. The electroactive polymer according to claim 7 wherein the polymer is poly 3,7-(phenoxathiin-4,4'-dithiobiphenylene) plus a charge compensating anionic dopant.

9. The electroactive polymer according to claim 6 or 3 wherein the recurring unit is phenothiazine.

10. The electroactive polymer according to claim 9 wherein the polymer is poly 3,7-(N-methyl phenothiazine-2,5-oxadiazole) plus a charge compensating anionic dopant.

11. The electroactive polymer according to claim 10 or 3 wherein the charge-compensating ionic dopant is an anion selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, acetate, benzoate, tosylate, or mixtures thereof.

12. A p-type electroactive polymer which comprises a charged polymer backbone and charge-compensating ionicdopants associated therewith of the formula:

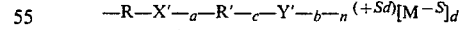

wherein a is 0 or 1; b is 0 or 1; c is 0 or 1; n is an integer from 1 to 1,000; d is an integer from 1 to 2,000; s is an integer 1, 2, or 3; R is a fused 6,6,6-membered unsaturated diradical-heterocyclic ring system wherein two heteroatoms are para in the central 6-membered ring and the heteroatoms are selected from the group consisting of O, S, N, N—$R_1$ wherein $R_1$ is lower alkyl $C_1$-$C_6$, aryl and cycloalkyl; R' is the same as R or a different fused 6,6,6-membered unsaturated heterocyclic ring system; X' is a connecting unit; Y' is the same connecting unit as X' or a different connecting unit; and M is a charge-compensating anionic dopant of opposite electrical charge to the charge of the polymer backbone wherein an X' or Y' connecting unit is selected from the group consisting of:

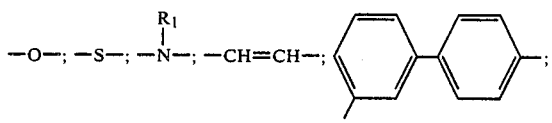

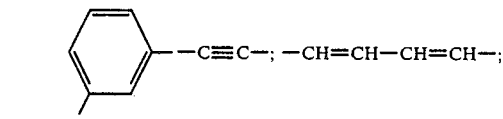

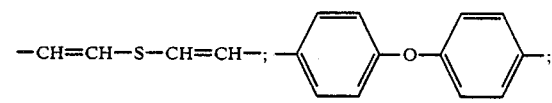

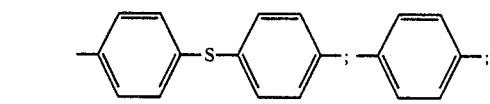

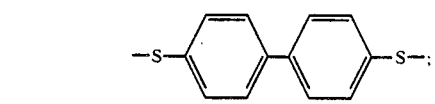

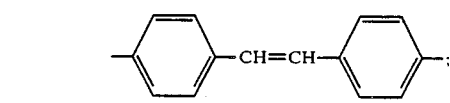

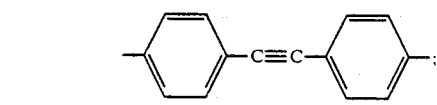

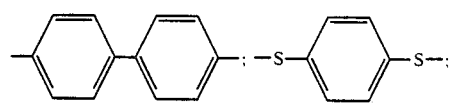

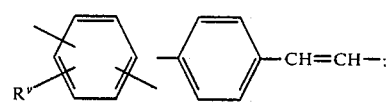

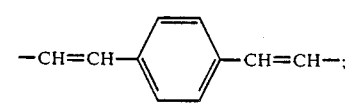

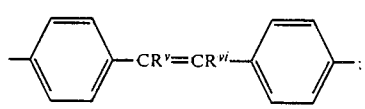

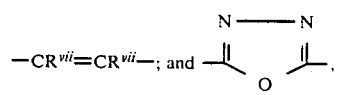

wherein $R_1$ is lower alkyl $C_1$—$C_6$, aryl and cyclo alkyl, and $R^v$, $R^{vi}$ and $R^{vii}$ are H, methyl, methoxy, halogen and mixtures thereof.

13. The electroactive polymer according to claim 12 wherein R and R' are diradicals of the formula:

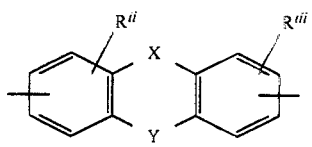

wherein X and Y are independently selected from the group consisting of substituted N, O, S, N—$R_1$; wherein $R_1$ is lower alkyl $C_1$-$C_6$, areyl, cyclo alkyl; $R^{ii}$ and $R^{iii}$ are from one to three substituent groups independently selected from H; disubstituted amino; alkyl of 1 to 4 carbon atoms; alkoxy of 1 to 4 carbon atoms; an alkylthio of 1 to 4 carbon atoms; a cycloaliphatic group of 5 to 6 carbon atoms; an aryl group of 6 to 10 carbon atoms; an aryl group of 6 to 10 carbon atoms substituted by 1 to 3 alkyl groups of 1 to 4 carbon atoms, alkoxy groups of 1 to 4 carbon atoms, 1 to 3 cyano groups, 1 to 3 halogen atoms, dialkyl amino groups of 1 to 4 carbon atoms, an alkylthiol 1 to 4 carbon atoms; a 5- or 6-member nitrogen-containing unsaturated heterocyclic group.

14. The electroactive polymer according to claim 13 wherein a, b and c are zero, and the polymer has the formula:

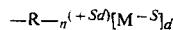

15. The electroactive polymer according to claim 12 or 13 wherein a is 1, b and c are zero, and the polymer has the formula:

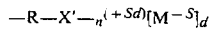

16. The electroactive polymer according to claim 15 wherein X and Y are O and S for the diradical R.

17. The electroactive polymer according to claim 15 where X and Y are N—$R_1$ and S for the diradical R.

18. The electroactive polymer according to claim 17 wherein X is S, Y is N—$R_1$, and $R_1$ is $CH_3$ for the diradical R and X' is

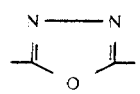

and the polymer has the formula:

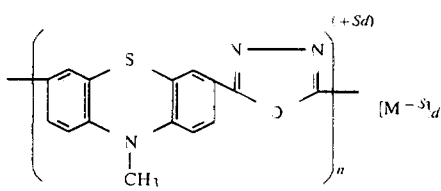

19. The electroactive polymer according to claim 18 wherein the charge-compensating ionic dopant M is an anion selected from the group consisting of $AsF_4^-$, $AsF_6^-$, $ClO_4^-$, $PF_6^-$, $SO_3CF_3^-$, $BF_4^-$, $NO_3^-$, $POF_4^-$, $CN^-$, $SiF_5^-$, $SbCl_6^-$, $SbF_6^-$, $HSO_4^-$, acetate, benzoate, tosylate, $F^-$, $Cl^-$, or mixtures thereof.

20. The polymer poly-3,7-(N-methylphenothiazine)-2,5-(1,3,4-oxadiazole).

* * * * *

UNITED STATES PATENT AND TRADEMARK OFFICE
CERTIFICATE OF CORRECTION

PATENT NO. : 4,505,841

DATED : March 19, 1985

INVENTOR(S) : Peter Denisevich, Jr.

It is certified that error appears in the above-identified patent and that said Letters Patent are hereby corrected as shown below:

Col. 4, line 30, "$-R-X')_a(R')_c(Y')_b]_n^{(+Sd)}[M^{-S}]_d$", should read
-- $[R-(X')_a(R')_c(Y')_b]_n \ (+Sd) \ [M^{-S}]_d$ --

Col. 4, line 45, "$-R-(X')_a(R')_c(Y')_b]_n \ (+Sd)$", should read
-- $[R-(X')_a(R')_c(Y')_b]_n$ --

Col. 7, line 13, "$-R-X'-_n \ (+Sd) \ [M^{-S}]_d$", should read
-- $[R-X']_n \ (+Sd) \ [M^{-S}]_d$ --

Col. 7, line 50, "$[M^{+S}]_d$", should read -- $[M^{-S}]$. --

Col. 9, line 55, "colar", should read --color--.

Col. 12, line 63, (Claim 2), "wherin", should read --wherein--.

Col. 14, line 17 (Claim 5), "and cyclo", should read --aryl, and cyclo--.

Col. 14, lines 52 & 53, (Claim 12), "chargecompensatingionicdopant" should read --change-compensating ionic dopants--.

Col. 16, line 12, (Claim 13), "areyl" should read --aryl--.

UNITED STATES PATENT AND TRADEMARK OFFICE
CERTIFICATE OF CORRECTION

PATENT NO. : 4,505,841

DATED : March 19, 1985

INVENTOR(S) : Peter Denisevich, Jr.

It is certified that error appears in the above-identified patent and that said Letters Patent are hereby corrected as shown below:

Col. 16, line 30 (Claim 14), "$-R-_n{}^{(+Sd)} [M^{-S}]_d$" should read -- $[-R-]_n{}^{(+Sd)} [{}^{-S}_M]_d$ Col. 16, line 35 (Claim 15) "$--R--X'--_n{}^{(\pm Sd)} [M^{-S}]_d$" should read -- $[R-X']_n{}^{(+Sd)} [M^{-S}]_d$ --.

Col. 16, line 2, (Claim 17), "where" should read --wherein--.

Signed and Sealed this

Eighth Day of October 1985

[SEAL]

Attest:

Attesting Officer

DONALD J. QUIGG

Commissioner of Patents and Trademarks—Designate